United States Patent
Lee et al.

(10) Patent No.: US 10,600,743 B2
(45) Date of Patent: Mar. 24, 2020

(54) ULTRA-THIN THERMALLY ENHANCED ELECTRO-MAGNETIC INTERFERENCE SHIELD PACKAGE

(71) Applicant: Inari Semiconductor Labs Sdn Bhd, Bayan Lepas (MY)

(72) Inventors: Ching-Fong Lee, Bayan Lepas (MY); Heap-Hooi Nyeo, Bayan Lepas (MY); Chin-Chooi Ch'ng, Bayan Lepas (MY); Ooi-Lin Cheng, Bayan Lepas (MY)

(73) Assignee: Inari Semiconductor Labs Sdn Bhd, Bayan Lepas (MY)

( * ) Notice: Subject to any disclaimer, the term of this patent is extended or adjusted under 35 U.S.C. 154(b) by 0 days.

(21) Appl. No.: 16/129,124

(22) Filed: Sep. 12, 2018

(65) Prior Publication Data
US 2019/0139902 A1    May 9, 2019

(30) Foreign Application Priority Data

Nov. 8, 2017  (MY) ............................... 2017704259

(51) Int. Cl.
| H01L 23/552 | (2006.01) |
| H01L 23/373 | (2006.01) |
| H01L 21/56 | (2006.01) |
| H01L 23/31 | (2006.01) |
| H01L 23/00 | (2006.01) |
| H01L 23/42 | (2006.01) |
| H01L 21/683 | (2006.01) |

(52) U.S. Cl.
CPC ............ *H01L 23/552* (2013.01); *H01L 21/56* (2013.01); *H01L 21/561* (2013.01); *H01L 21/568* (2013.01); *H01L 21/6835* (2013.01); *H01L 21/6836* (2013.01); *H01L 23/3107* (2013.01); *H01L 23/3121* (2013.01); *H01L 23/3185* (2013.01); *H01L 23/3736* (2013.01); *H01L 23/3737* (2013.01); *H01L 23/42* (2013.01); *H01L 24/08* (2013.01); *H01L 2221/68331* (2013.01)

(58) Field of Classification Search
CPC .... H01L 21/782; H01L 21/784; H01L 21/786
See application file for complete search history.

(56) References Cited

U.S. PATENT DOCUMENTS

| 9,543,242 B1 * | 1/2017 | Kelly ................ H01L 23/49816 |
| 2011/0006408 A1 * | 1/2011 | Liao ...................... H01L 21/561 257/660 |
| 2018/0294233 A1 * | 10/2018 | Yoon ....................... H01L 21/78 |

* cited by examiner

*Primary Examiner* — Cheung Lee
(74) *Attorney, Agent, or Firm* — Preston Smirman; Smirman IP Law, PLLC

(57) ABSTRACT

A method to fabricate an electronic package is described and includes the steps of: connecting a plurality of semiconductor chips to at least one surface of a substrate using a connect pad; encapsulating the semiconductor chips with a non-conductive material; and forming an electro-magnetic interference shield layer over the encapsulated semiconductor chip.

10 Claims, 6 Drawing Sheets

ULTRA-THIN THERMALLY ENHANCED ELECTRO-MAGNETIC INTERFERENCE SHIELD PACKAGE

CROSS-REFERENCE TO RELATED APPLICATION

The instant application claims priority to Malaysia Patent Application Serial No. PI 2017704259 filed Nov. 8, 2017, the entire specification of which is expressly incorporated herein by reference.

FIELD OF THE INVENTION

This invention relates to an electronic package and more particularly to a method to fabricate a thin and thermally enhanced electronic package with electro-magnetic interference shield.

BACKGROUND OF THE INVENTION

Electronic devices are moving toward a trend of smaller, thinner, better performing and cheaper. In general while chip performance improve, heat generated by the chip also increase and when the chip heat up, performance of the chip will degrade.

The electronic devices are indispensable elements used among all kinds of technological products, such as various electric appliances which need to be controlled by electric circuits. All the electronic devices, may have at least one kind of electro-magnetic interference shielding structures. The main functionalities of the electro-magnetic interference shielding structures are to prevent the electronic devices from influencing the outer environments, or avoiding the units or modules within the electronic devices from interfering one another. The electro-magnetic interference shielding structure mainly includes the substrate unit, the electronic circuit unit, the metal shielding unit, and the electrical connection unit. The electronic device can work normally in a non-interfering environment by the shielding effect provided by the electro-magnetic interference shielding structures. Existing structure is too complicated, product thickness is too thick, the shielding effect is poor, and the surfaces of the structure are too easy to become rusty.

Besides, electro-magnetic interference between electronic packages may further degrade the performance of the electronic device. Conventional electronic device using metal casing to minimize the electro-magnetic interference and improve heat dissipation of electronic packages but this increases the cost and size of the electronic device.

To achieve thinner, smaller and lower cost, the electronic package needs to be simple and able to fabricate with high speed and highly automated process. To improve the performance of electronic device, electronic package needs to improve package level heat dissipation and minimize the interference of electro-magnetic field from other electronic package.

Therefore, the present invention provides a fabrication method for producing a thinner electronic package with better heat dissipation and electro-magnetic interference shield.

SUMMARY OF THE INVENTION

The present invention provides a method to fabricate an electronic package comprises the steps: connect a plurality of semiconductor chips to at least one surface of a substrate using a connect pad; encapsulate the semiconductor chips with a non-conductive material; and, form an electro-magnetic interference shield layer over the encapsulated semiconductor chip.

Preferably, the substrate is a single layer or multilayer substrate with at least one ground trace.

Preferably, thickness of the semiconductor chip is reduced by a process of trimming or grinding from the top encapsulation layer to the semiconductor chip to form a thin semiconductor chip.

Further, the substrate includes at least one ground terminal and is electrically connected to the ground trace.

Preferably, the encapsulation layer is cut through expose the ground trace of the substrate.

Further, a carrier is disposed on one side of the substrate.

Preferably, the electro-magnetic interference shield layer extends over the side surface of the substrate.

Preferably, the electro-magnetic interference shield layer covers the bottom surface of the semiconductor chip.

Preferably, edges of the encapsulation layer and the electro-magnetic interference shield layer are bevelled by a process of cutting.

Preferably, the connect pad is a chip connect pad and substrate to chip connect pad.

The present invention also provides an electronic package comprises: a substrate; a plurality of semiconductor chips, connected to the substrate via a connect pad; an encapsulation layer, surrounding the semiconductor chip with a non-conductive material; and, an electro-magnetic interference shield layer, formed over the encapsulated semiconductor chip.

Preferably, the substrate is a single layer or multilayer substrate with at least one ground trace.

Preferably, thickness of the semiconductor chip is reduced by a process of trimming or grinding from the top surface of the encapsulation layer to the semiconductor chip to form a thin semiconductor chip.

Further, the substrate includes at least one ground terminal and is electrically connected to the ground trace.

Preferably, the encapsulation layer is cut through expose the ground trace of the substrate.

Preferably, a carrier is disposed on one side of the substrate.

Preferably, the electro-magnetic interference shield layer extends over the side surface of the substrate.

Preferably, the electro-magnetic interference shield layer covers the bottom surface of the semiconductor chip.

Preferably, edges of the encapsulation layer and the electro-magnetic interference shield layer are bevelled by a process of cutting.

Preferably, the connect pad is a chip connect pad and a substrate to chip connect pad.

Preferably, the electro-magnetic interference shield layer is an electrical conductive encapsulate material with or without conductive filler.

Preferably, the filler is made of a graphene, graphite, permalloy, mu-metal, nickel, stainless steel, silver, copper, gold or any other suitable material.

BRIEF DESCRIPTION OF THE DRAWINGS

These and other features, aspects, and advantages of the present invention will become better understood, when the following detailed description is read with reference to the accompanying drawings in which like characters represent like parts throughout the drawings, wherein.

DETAILED DESCRIPTION OF THE INVENTION

The present invention provides a method to fabricate a thin electronic package (10, 20, 30) and encapsulate it with an electrical conductivity encapsulate material. The electrical conductive encapsulate layer serve as an electro-magnetic interference shield to the electronic package to reduce the electro-magnetic interference from other electronic package. The electro-magnetic interference shield layer is thicker than conventional electro-magnetic interference shield which uses coating method and provides better prevention on leakage due to scratches. The electrical conductive encapsulate and electro-magnetic interference shield layer also provides better heat dissipation than standard encapsulation material. Furthermore the electro-magnetic interference shield layer is formed on the thin semiconductor chip, creates an effective path for heat to release from back side of the semiconductor chip.

Figure 1:
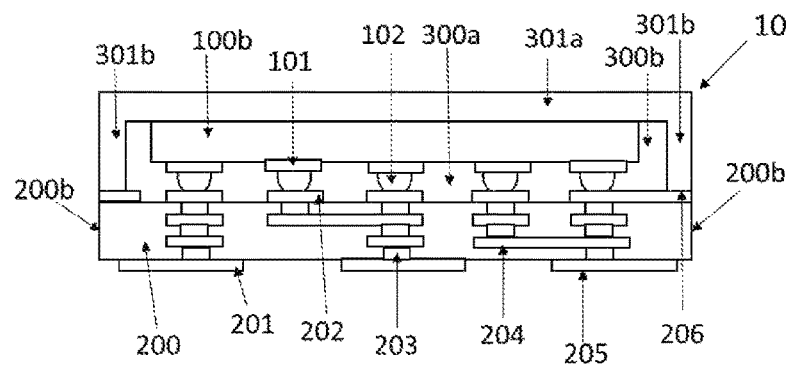
FIGS. 1, 8 and 17 are the cross section views of an electronic package according to various embodiments of the present invention.
Figure 8:
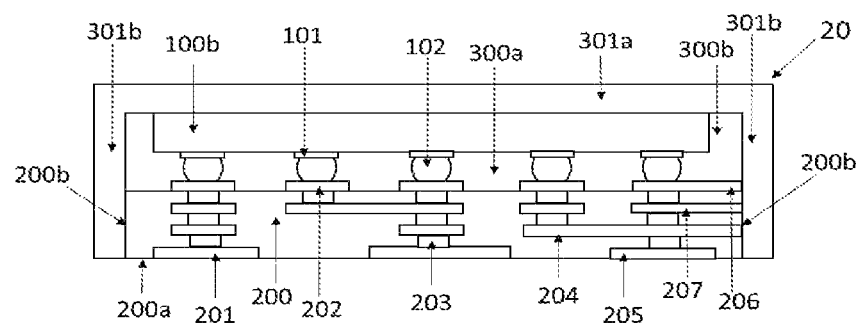
Figure 17:
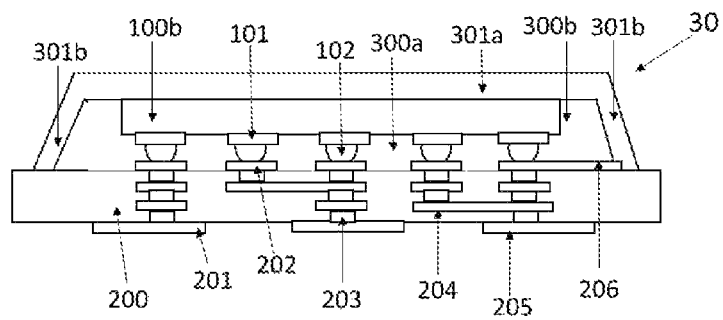

Referring to FIGS. 1, 8 and 17 are cross sectional views of the electronic package (10, 20, 30) which consists of a substrate (200), semiconductor chip (100a), thin semiconductor chip (100b), encapsulation layer which consists of an underfill encapsulation layer (300a), side encapsulation layer (300b) and top encapsulation layer (300c), ground trace (204, 206, 207), ground terminal (201, 205), and electro-magnetic interference (EMI) shield layer (301a, 301b).

Referring to FIGS. 1 and 8 illustrates the electronic package (10, 20) fabricate with array type substrate (200). FIG. 17, illustrates the electronic package fabricate with single unit substrate (200). The semiconductor chip (100a) can be single chip or multiple chip and can be electrically connected to the substrate (200) circuit through flip chip connection or wire connection or in the combinations. Example of flip chip connection, the semiconductor chip (100a) can be connected to the substrate (200) through a chip connect pad (101) and substrate to chip connect pad (102) using connect material like solder paste or high conductive epoxy. Substrate surface circuit pad (202) is disposed on the surface of the substrate (200). The substrate to chip connect pad (102) is disposed in between the chip connect pad (101) and the substrate surface circuit pad (202). The connect material (102) may be any electrical conductive material for example any type of solder paste or electrical conductive paste. A substrate connection (203) is arranged between the ground trace (204, 206, 207) connects electrically between them in the substrate (200).

The substrate (200), can be a printed circuit board, molded interconnect substrate, ceramic substrate, flex printed circuit board, or any substrate used to attach the semiconductor chip. Further, the substrate (200) may be a single layer substrate or a multilayer substrate with at least one ground trace (204, 206, 207) connected to edge of the electronic package (10, 20, 30) and electrically connected to the conductive electro-magnetic interference shield layer (301a, 301b). The EMI shield layer (301a, 301b) has a top EMI shield layer (301a) and side EMI shield layer (301b). The multilayer substrate (200) with the ground trace (206) connects to the side EMI shield layer (301b) can be seen in electronic packages (10 and 30) of FIGS. 1 and 17. The electronic package (20) shows the multi ground trace (204, 206, 207) connect to the electro-magnetic interference shield layer side surface (301b). The ground trace (204, 206, 207) electrically connect to at least one ground terminal (201, 205) of the substrate (200). The ground trace (204, 206, 207) can be a metal trace with or without plating, electrical conductive ink or paste.

An underfill encapsulation layer (300a) is an encapsulate material filled in the gap between the semiconductor chip (100a) and the substrate (200) can be any non-electrical conductive encapsulate material. The side encapsulation layer (300b), encapsulates the semiconductor chip (100a) can be a non-electrical conductive encapsulate mold compound or chip coat material. The material used for underfill encapsulation layer (300a) and side encapsulation layer (300b) can be the same material.

The EMI shield layer (301a, 301b) can be an electrical conductive encapsulate material with or without conductive filler. The filler can be metallic or non-metallic material or combination of them. For example, graphene, graphite, permalloy, mu-metal, nickel, stainless steel, silver, copper, silica and gold. For better electro-magnetic interference absorption, filler of graphene, graphite, permalloy, mu-metal, nickel, silica and stainless steel can be used. The size, quantity and type of filler impact the electro-magnetic interference shield efficiency, workability and reliability. The use of the silica filler in mold compound with graphene/graphite to perform second layer molding to form the EMI shield layer (301a, 301b) over the encapsulated chips provides better the electro-magnetic interference shielding efficiency. Further, it can impact mold flow and mold compound adhesion strength. The EMI shield layer (301a, 301b) can directly contact with the back side or bottom surface of the semiconductor chip (100a, 100b), the EMI shield layer (301a, 301b) with high thermal conductive filler serves as heat slug to improve heat dissipation. The thin semiconductor chip (100b) shortens the path for heat to release.

To ensure better electro-magnetic shield efficiency thickness of the EMI shield layer (301a, 301b) maybe reduced to 25 um or thicker. The thicker the EMI shield layer (301a, 301b) the better the electro-magnetic interference shield efficiency and thicker electro-magnetic interference shield prevents electro-magnetic interference leakage due to scratches. The top EMI shield layer (301a) may or may not have direct contact with the thin semiconductor chip (100b). For better heat dissipation, the top EMI shield layer (301a) is in direct contact with the thin semiconductor chip (100b).

The side EMI shield layer (301b) may extends over the surface of the encapsulation layer area, and covers part of the side surface (200b) or fully extends over the side surface (200b) of the substrate (200). The side EMI shield layer (301b) may not cover/extend to the bottom surface (200a) of the substrate (200). The electronic packages (10, 30) are the examples with the EMI shield layer (301b) that connect directly with the ground trace (206). The electronic package (20) illustrates with side surface EMI shield layer (301b)

fully covers the side surface (200b) of the substrate (200) and connect with the ground trace (204, 206 and 207).

In first embodiment, FIGS. 2 to 7 illustrates a process of fabricating the electronic package (10) shown in FIG. 1. The electronic package (10) is an array fabricate electronic package with full electro-magnetic interference shield on encapsulate surface and partial shield on substrate side surface.

Figure 2:
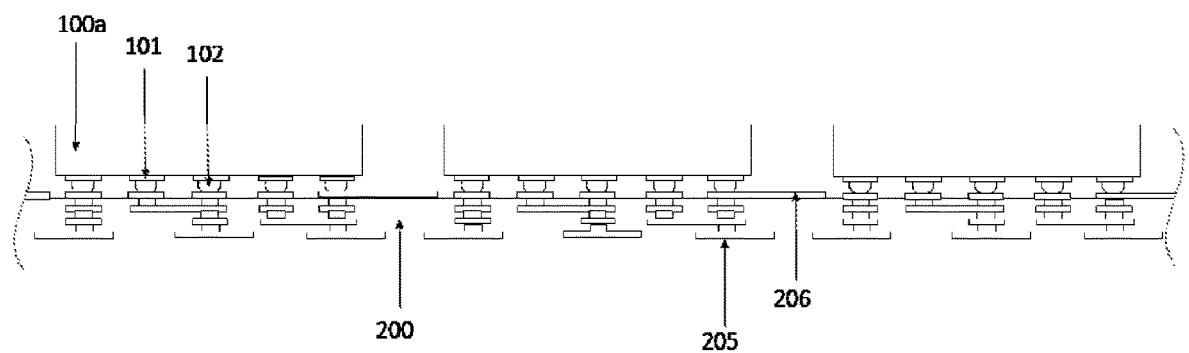
FIGS. 2 to 7 illustrate a process of fabricating the electronic package as shown in FIG. 1, according to an embodiment of the present invention.

Referring to FIG. 2, a conductive substrate (200) is provided. A plurality of semiconductor chips (100a) are attached or connected to the substrate (200) via a connect pad which can be a chip connect pad (101) and substrate to chip connect pad (102). The substrate (200) can be a printed circuit board, molded interconnect substrate, ceramic substrate, flex printed circuit board, or any substrate used to attach the chip (100a). The substrate (200) can be a single layer substrate or multilayer substrate with at least one ground trace (204, 206, 207) connect to the edge of electronic package (10, 20, 30). In the present invention, a multi-layer substrate (200) is used. The ground trace can be located on the top layer (206) or inner layer (204 and 207) of the substrate (200).

Figure 3:
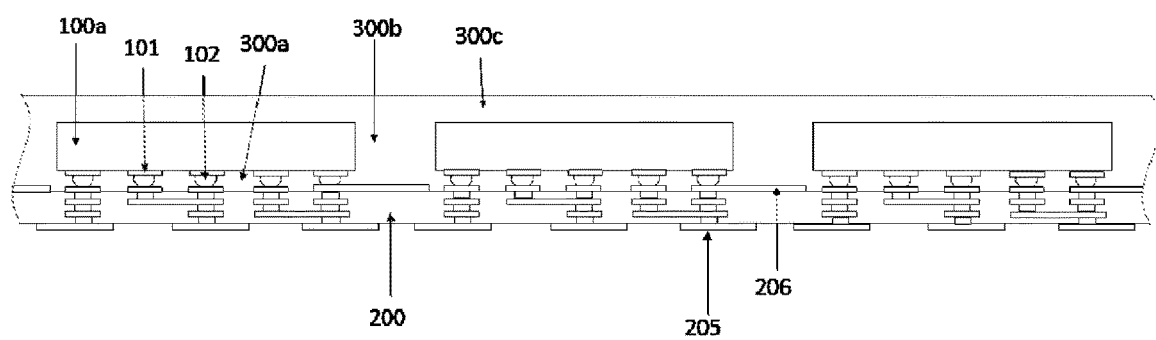

Next, referring to FIG. 3, an encapsulation layer (300a, 300b, 300c) is formed to encapsulate the semiconductor chips (100a) on the substrate (200) by a molding process. The underfill encapsulation layer (300a) fills the gap between the semiconductor chip (100a) and the substrate (200). The top encapsulation layer (300c) covers of the top surface of the semiconductor chip (100a). The side encapsulation layer (300b) fills the gap in between the semiconductor chips (100a).

Figure 4:
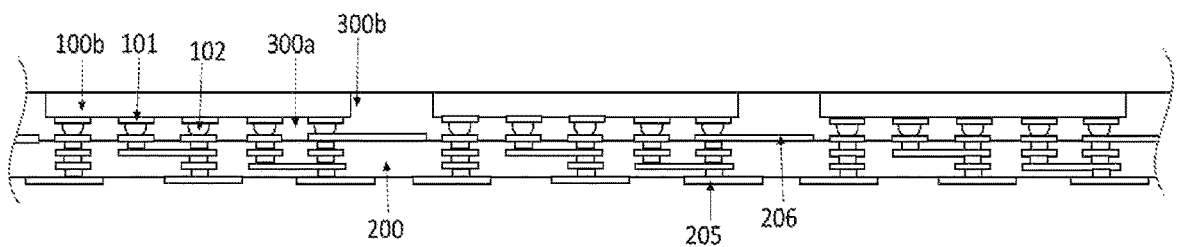

Next referring to FIG. 4, the top grind process is performed to remove the top encapsulation layer (300c) such that the thickness of the semiconductor chip (100a) is reduced to form a thin semiconductor chip (100b) and expose the top surface of the thin semiconductor chip (100b). This process forms the thin electronic package. The side encapsulation layer (300b), underfill encapsulation layer (300a) and the substrate to chip connect pad (102) holds the thin semiconductor chip (100b) firmly to avoid any crack on the semiconductor chip (100a) during the top grind process. The thin semiconductor chip (100b) provides better heat dissipation. This grinding process is an optional, if the electronic package does not have heat dissipation and/or package height issue top grinding can be skipped.

Figure 5:
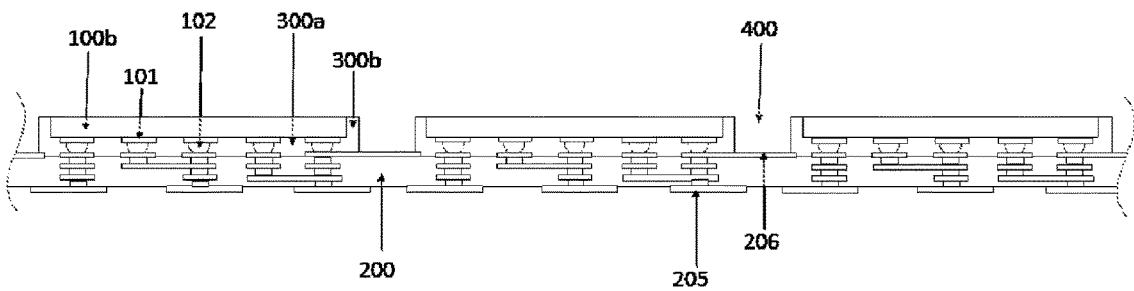

Then, referring to FIG. 5, the half saw process is performed to remove the side encapsulation layer (300b) until the ground trace (206) of the substrate (200) is exposed. The saw blade used to perform the sawing is wider than final package saw blade to form a wider saw groove (400).

Figure 6:
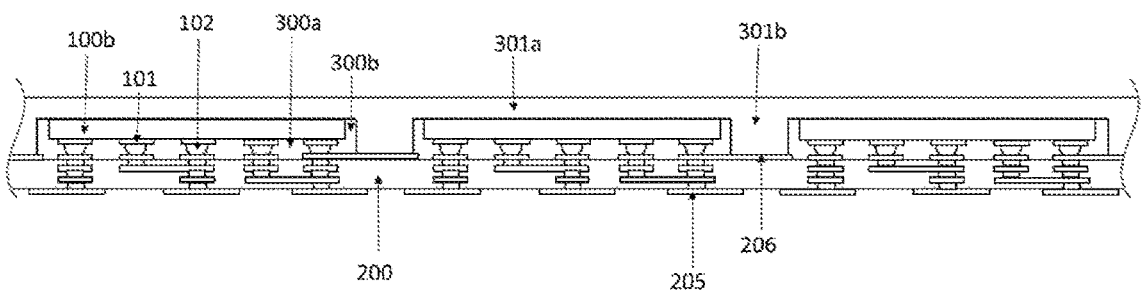

Then, referring to FIG. 6, the EMI shield layer (301a, 301b) is formed where the encapsulated chip is disposed within it. The EMI shield layer (301a, 301b) is formed by the molding process and may contact directly with the top surface of the thin semiconductor chip (100b). The trimming process or grinding process can be performed on the EMI shield layer (301a, 301b) to form the thinner electronic package.

Figure 7:
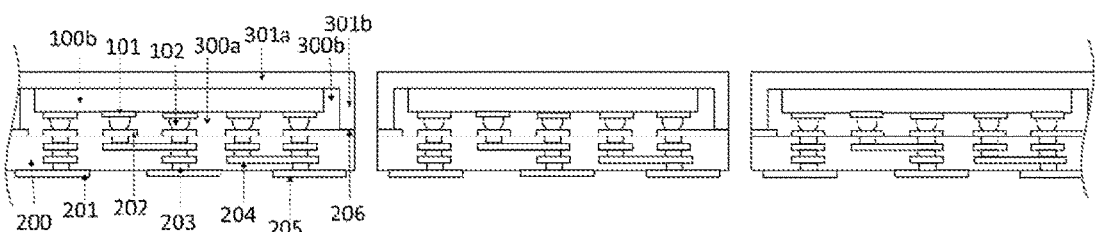

Next, referring to FIG. 7, the half saw process is performed where the saw is used to cut through the substrate (200) such that individual units of the electronic package (10) are formed. The EMI shield layer (301a, 301b) covers the encapsulation layer (300a, 300b, 300c). The side surface (200b) of the substrate (200) and the ground terminal (201, 205) are exposed.

In a second embodiment, FIGS. 9 to 15 illustrate the fabrication steps of the electronic package (20) as shown in FIG. 8. The electronic package (20) is the array fabricate electronic package with electro-magnetic interference shield formed on the top encapsulation layer (300c), side encapsulation layer (300b) and side surface (200b) of the substrate (200).

Figure 9:
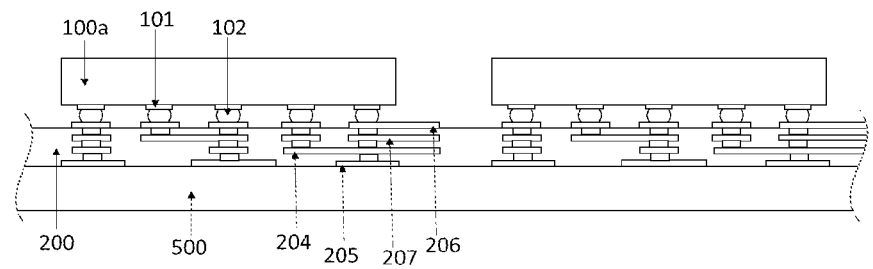
FIGS. 9 to 15 illustrate a process of fabricating the electronic package as shown in FIG. 8, according to another embodiment of the present invention.

Referring to FIG. 9, illustrates the cross section view of the electronic package (20) after the semiconductor chip (100a) connected on the substrate (200). A substrate carrier (500) is disposed on one side of the substrate (200) and it can be a metal carrier or adhesive tape. The ground terminal (201, 205) of the substrate (200) is disposed within.

Figure 10:
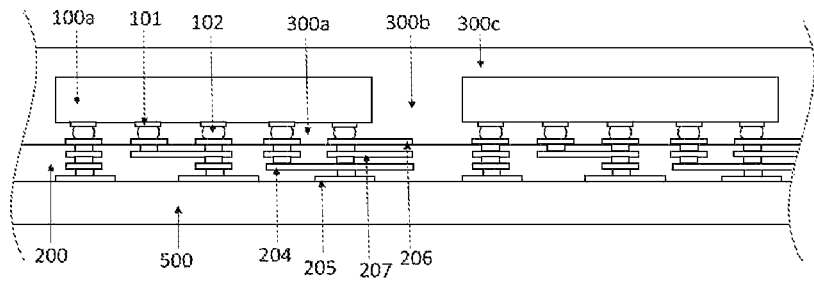

Next, referring to FIG. 10, the encapsulation layer (300a, 300b, 300c) is formed to encapsulate the semiconductor chip (100a) on the substrate (200) such that the semiconductor chip (100a) is disposed within the encapsulation layer.

Figure 11:
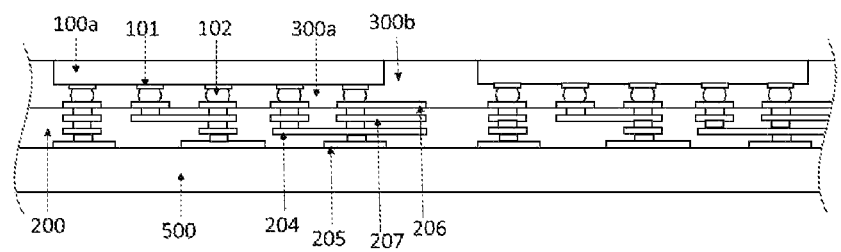

Next, referring to FIG. 11, top grind process is performed to remove the top encapsulation layer (300c) of the semiconductor chip (100a) and further the semiconductor chip (100a) is grinded to reduce the thickness to form the thin semiconductor chip (100b).

Figure 12:
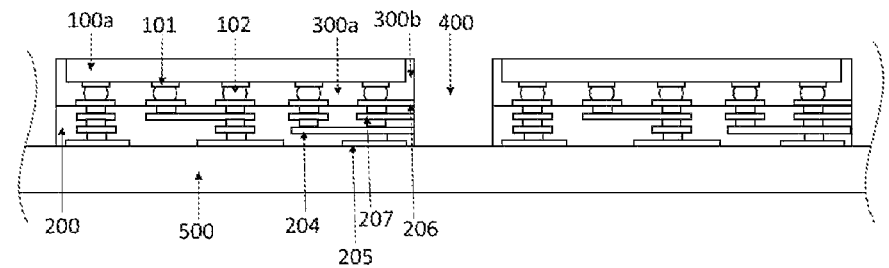

Then, referring to FIG. 12, the half saw process is performed to remove the side encapsulation layer (300b) until the top surface of the substrate (200) is exposed.

Figure 13:
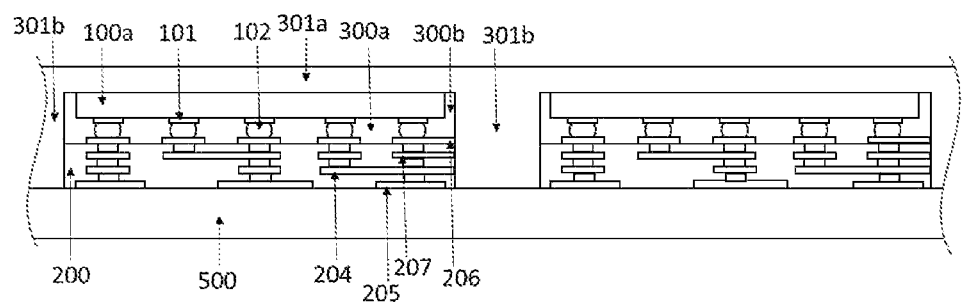

Then, referring to FIG. 13, the EMI shield layer (301a, 301b) is formed on the encapsulated chips (100b) by the molding process where the encapsulated chip is disposed within it. The substrate carrier (500) ensures that the EMI shield layer (301b), does not slip into the bottom substrate (200a) of the surface (200).

Figure 14:
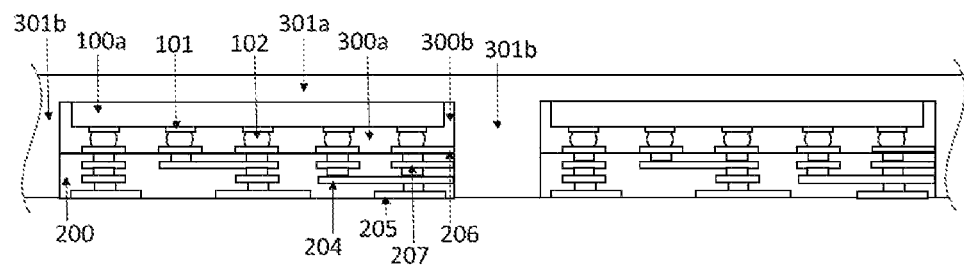
Figure 15:
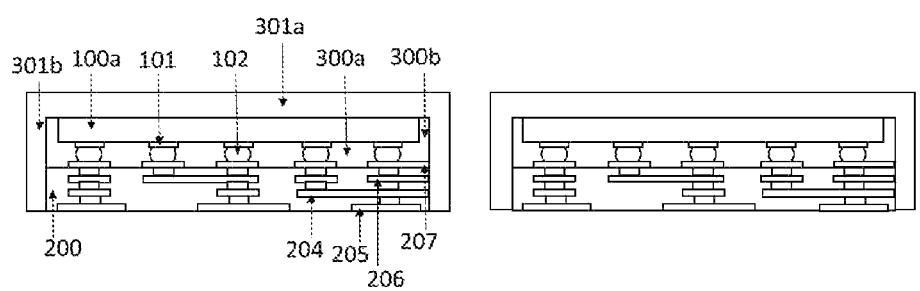

Next referring to FIGS. 14 and 15, the substrate carrier (500) can be removed and the half saw process is performed where the saw is used to cut through the substrate (200) such that individual units of the electronic package (20) are formed. The EMI shield layer (301a, 301b) covers the encapsulation layer (300a, 300b) and the side surface (200b) of the substrate (200). The ground terminal (201, 205) is disposed within the substrate (200).

Figure 16:
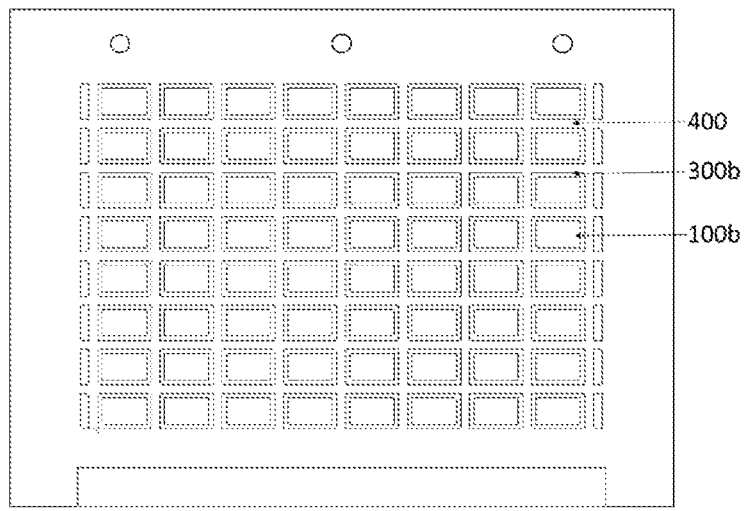
FIG. 16 is a top view of the electronic package shown in FIGS. 5 and 12 in array form, according to the present invention.

Referring to FIG. 16, illustrate the top view of the FIGS. 5 and 12, the top encapsulation layer (300c) is grinded or trimmed to reduce the thickness of the semiconductor chip (100a) to form the thin semiconductor chip (100b) and exposes the top surface of the thin semiconductor chip (100b).

In a third embodiment, FIGS. 18 to 21 illustrate the fabrication steps for the electronic package (30) as shown in FIG. 17. The electronic package (30) is a singulate fabricate electronic package with full electro-magnetic interference shield on encapsulate surface and partial shield on substrate side surface.

Figure 18:
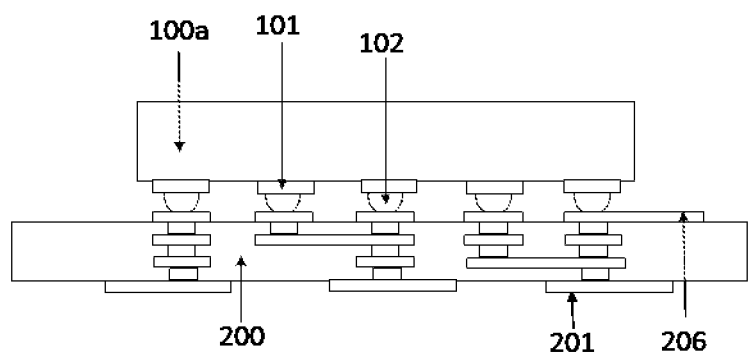
FIGS. 18 to 21 illustrate a process of fabricating the electronic package as shown in FIG. 17, according to another embodiment of the present invention.

Referring to FIG. 18, semiconductor chips (100a) are connected or attached on the substrate (200), where the substrate to chip connect pad (102) and the ground terminal (201, 205) are exposed.

Figure 19:
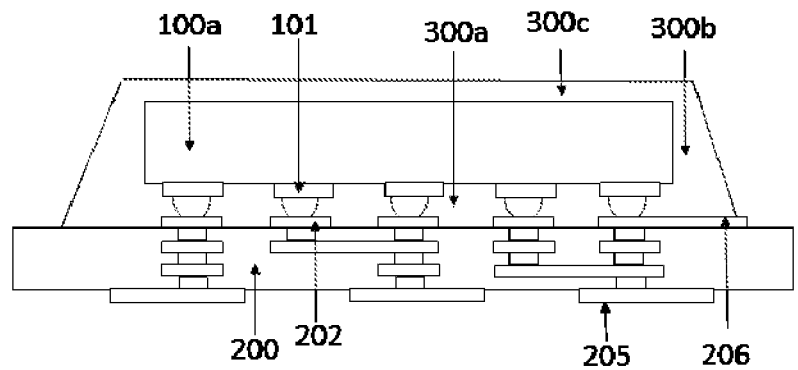

Next referring to FIG. 19, the encapsulation layer (300a, 300b, 300c) is formed on the substrate (200) to encapsulate the semiconductor chip (100a). The side encapsulation layer (300b) or edges may be bevelled by the cutting process.

Figure 20:
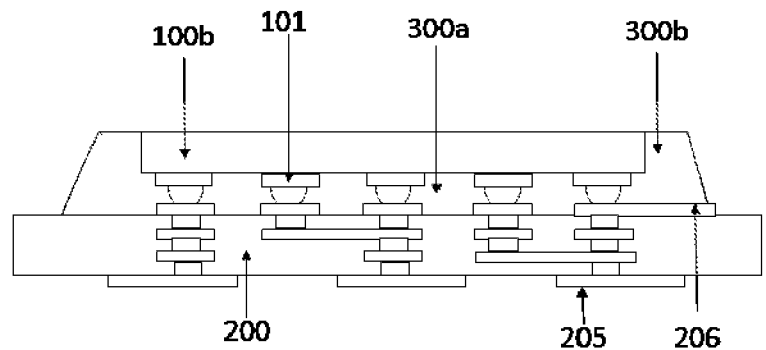

Next referring to FIG. 20, the top grind process is performed to remove the top encapsulation layer (300c) by the grinding or trimming process to reduce the thickness of the semiconductor chip (100a) to form the thin semiconductor chip (100b) and exposes the top surface of the thin semiconductor chip (100b).

Figure 21:
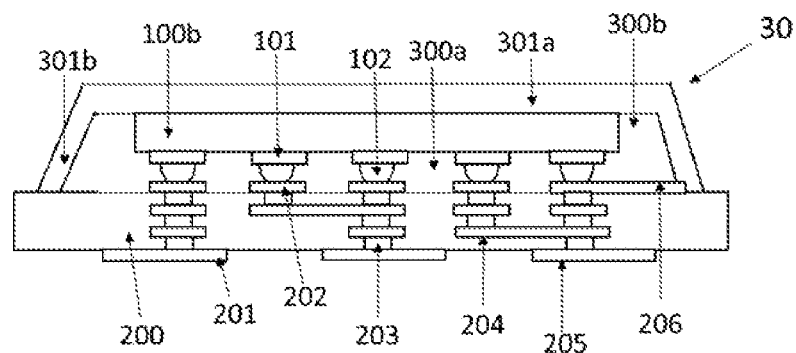

Then, referring to FIG. 21, the EMI shield layer (301a, 301b) is formed on the encapsulation layer (300a, 300b) where the side surfaces or edges of the EMI shield layer are bevelled by the cutting process.

The present invention may be embodied in other specific forms without departing from its essential characteristics. The described embodiments are to be considered in all respects only as illustrative and not restrictive. The scope of the invention is, therefore indicated by the appended claims rather than by the foregoing description. All changes, which come within the meaning and range of equivalency of the claims, are to be embraced within their scope.

What is claimed is:

1. A method of fabricating an electronic package, comprising the steps of:
   connecting a plurality of semiconductor chips to at least one surface of a substrate using a connect pad;
   encapsulating the semiconductor chips with a non-conductive material by a first molding process;
   reducing a thickness of the semiconductor chips by a process of trimming or grinding from a top encapsulation layer of the semiconductor chips to form thin semiconductor chips; and
   forming an electro-magnetic interference shield layer over the thin semiconductor chips by a second molding process.

2. The method according to claim 1, wherein the substrate is a single layer or multilayer substrate with at least one ground trace.

3. The method according to claim 1, wherein the substrate includes at least one ground terminal and is electrically connected to a ground trace.

4. The method according to claim 3, wherein the encapsulation layer is cut through exposing the ground trace on the substrate.

5. The method according to claim 4, wherein a carrier is disposed on one side of the substrate.

6. The method according to claim 5, wherein the electro-magnetic interference shield layer extends over a side surface of the substrate.

7. The method according to claim 6, wherein the electro-magnetic interference shield layer covers a bottom surface of the semiconductor chip.

8. The method according to claim 1, wherein edges of the encapsulation layer and the electro-magnetic interference shield layer are bevelled by a process of cutting.

9. The method according to claim 8, wherein the connect pad is a chip connect pad and a substrate to chip connect pad.

10. The method according to claim 1, wherein at least part of the electro-magnetic interference shield layer is in contact with the thin semiconductor chips without a gap formed therebetween.

* * * * *